United States Patent
Chen et al.

(10) Patent No.: US 12,096,571 B2
(45) Date of Patent: Sep. 17, 2024

(54) ROTARY KNOB LOCK, MAINTENANCE TOOL AND LED DISPLAY

(71) Applicant: UNILUMIN GROUP CO., LTD, Shenzhen (CN)

(72) Inventors: Falong Chen, Shenzhen (CN); Kuang Yang, Shenzhen (CN); Pinglin Zhao, Shenzhen (CN)

(73) Assignee: UNILUMIN GROUP CO., LTD, Shenzhen (CN)

( * ) Notice: Subject to any disclaimer, the term of this patent is extended or adjusted under 35 U.S.C. 154(b) by 181 days.

(21) Appl. No.: 17/866,392

(22) Filed: Jul. 15, 2022

(65) Prior Publication Data

US 2022/0354002 A1  Nov. 3, 2022

Related U.S. Application Data

(63) Continuation of application No. PCT/CN2021/105240, filed on Jul. 8, 2021.

(30) Foreign Application Priority Data

Aug. 25, 2020 (CN) .................. 202021801457.X

(51) Int. Cl.
*G06F 1/16* (2006.01)
*F16B 1/00* (2006.01)
(Continued)

(52) U.S. Cl.
CPC ............. *H05K 5/0017* (2013.01); *F16B 1/00* (2013.01); *H01F 7/0205* (2013.01); *F16B 2200/83* (2023.08)

(58) Field of Classification Search
CPC .... G06F 1/1601; G06F 1/1637; G06F 1/1656; G06F 1/1675; G06F 1/1679; H05K 5/0208

See application file for complete search history.

(56) References Cited

U.S. PATENT DOCUMENTS 9,845,816 B2 * 12/2017 Brashnyk ............. F16M 13/022
10,626,961 B2    4/2020 Heo et al.
(Continued)

FOREIGN PATENT DOCUMENTS

CN     203297209 U    11/2013
CN     204332274 U    5/2015
(Continued)

OTHER PUBLICATIONS

International Search Report and Written Opinion issued in corresponding PCT Application No. PCT/CN2021/105240, dated Sep. 16, 2021.

(Continued)

*Primary Examiner* — Anthony Q Edwards
(74) *Attorney, Agent, or Firm* — Westbridge IP LLC

(57) ABSTRACT

Disclosed are a rotary knob lock, a maintenance tool and an LED display. The rotary knob lock includes a lock body, the lock body includes a head part and a limit part, a diameter of the head part is larger than a diameter of the limit part, the head part is provided with a first magnet, the limit part is provided with a limit block; the maintenance tool includes a body, the body is provided with a second magnet inside, the second magnet and the first magnet of the rotary knob lock are magnetically attracted to each other; the LED display includes an LED display module and a cabinet, the LED display module is provided with a rotary knob lock, the cabinet is provided with an avoidance hole, when the LED display module is mounted on the cabinet, the first magnet and limit block are located on both sides.

10 Claims, 3 Drawing Sheets

(51) Int. Cl.
*H01F 7/02* (2006.01)
*H05K 5/00* (2006.01)

(56) References Cited

U.S. PATENT DOCUMENTS

2017/0360171 A1* 12/2017 Weber .................. F16B 1/00
2020/0063767 A1* 2/2020 Jung .................... H05K 7/02
2020/0196462 A1* 6/2020 Kim ..................... H05K 5/0017
2023/0064997 A1* 3/2023 Yang .................... H05K 5/0208
2024/0079397 A1* 3/2024 Li ........................ H01L 25/167

FOREIGN PATENT DOCUMENTS

| CN | 208967368 U | 6/2019 |
| CN | 209831496 U | 12/2019 |
| CN | 212959400 U | 4/2021 |
| KR | 101705512 B1 | 2/2017 |

OTHER PUBLICATIONS

European Search Report issued in counterpart European Patent Application No. EP 21859909.0, dated Nov. 30, 2023.

* cited by examiner

ROTARY KNOB LOCK, MAINTENANCE TOOL AND LED DISPLAY

CROSS-REFERENCE TO RELATED APPLICATIONS

The present application is a continuation of International Application No. PCT/CN2021/105240, filed on Jul. 8, 2021, which claims priority to Chinese Patent Application No. 202021801457.X, titled "Rotary Knob Lock, Maintenance Tool and LED Display" and filed on Aug. 25, 2020. The disclosures of the above-mentioned applications are incorporated herein by reference in their entireties.

TECHNICAL FIELD

The present application relates to the technical field of light-emitting diode (LED) display, in particular to a rotary knob lock, a maintenance tool and an LED display.

BACKGROUND

With the continuous development of LED display technology, lean requirements on the design of the fixing method in the LED display field becomes more obvious, and the simplicity and practicality of the fixing method become more important in the development of the LED display industry. Currently, the LED module is fixed on the cabinet with the screw, however, the disassembly and installation of the screws become tedious, and a large of labor force and materials are consumed.

SUMMARY

The purpose of the present application is to provide a rotary knob lock, a maintenance tool and a LED display, to solve the technical problem that the disassembly and installation of the LED module become tedious due to the screws, and a large of labor force and materials are consumed.

The above technical purpose of the present application is achieved by the following technical solutions.

One aspect of the present application provides a rotary knob lock, comprising a lock body, the lock body including a head part and a limit part, wherein the head part has a diameter greater than a diameter of the limit part, the head part is provided with a first magnet inside, and the limit part is provided with a limit block.

Another aspect of the present application provides a maintenance tool, including a body, the body being provided with a second magnet inside, which is magnetically attracted to a first magnet of the rotary knob lock.

Another aspect of the present application provides an LED display, including an LED display module and a cabinet, wherein the LED display module is provided with a rotary knob lock, a lock body of the rotary knob lock comprises a head part and a limit part, the head part has a diameter larger than a diameter of the limit part, the head part is provided inside with a first magnet, the limit part is provided with a limit block; the cabinet is provided with an avoidance hole, when the LED display module is mounted on the cabinet, the first magnet and the limit block are distributed on both sides of the avoidance hole.

The present application has the following beneficial effects: after the rotary knob lock is fixedly mounted in the LED display module, the maintenance tool is first placed on the front of the LED display module and aligns approximately with the rotary knob lock. The first magnet and the second magnet are attracted together for opposite poles, thus the body of the maintenance tool is aligned with the lock body of the rotary knob lock and magnetically attracted to each other, and then the original magnetic field is changed by rotating the body of the maintenance tool to generate the torque to drive a rotation of the lock body of the rotary knob lock, to realize the locking and unlocking, and then to realize the fixing and disassembly of the LED display module. The structure is simple, the operation of locking and unlocking is easy, the maintenance is convenient and saves time and effort.

DETAILED DESCRIPTION OF THE EMBODIMENTS

In order to make the technical problems to be solved, technical solutions and beneficial effects of the present application clearer and more understandable, the present application is described in further detail hereinafter in conjunction with the drawings and embodiments. It should be understood that the specific embodiments described herein are used only to explain, but not limit, the present application.

Figure 1:
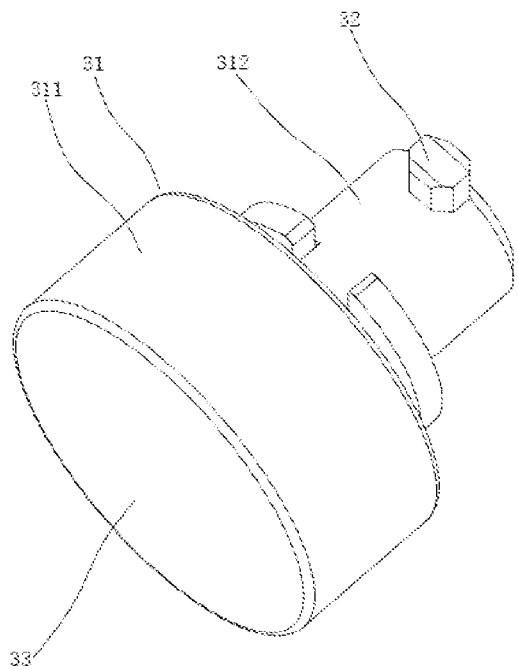
FIG. 1 is an enlarged structural view of a rotary knob lock of an embodiment of the present application.
Figure 2:
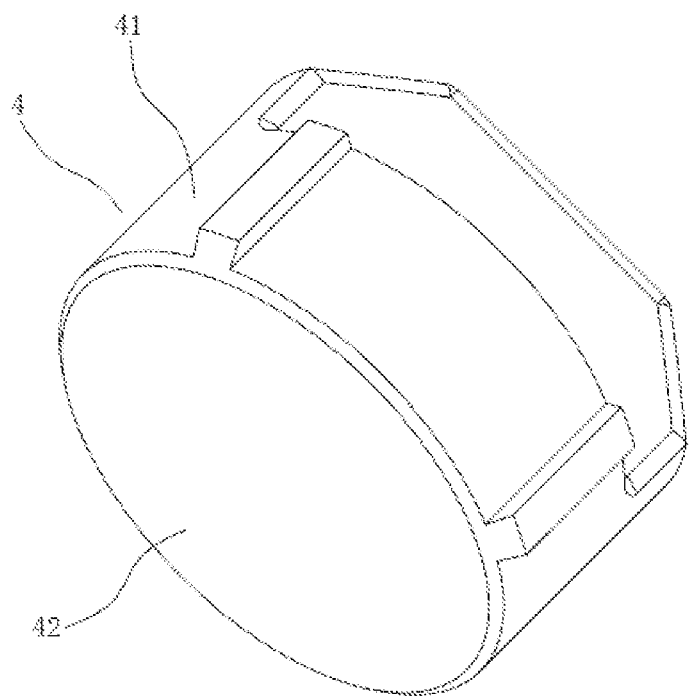
FIG. 2 is an enlarged structural view of a maintenance tool of an embodiment of the present application.

As shown in FIG. 1, the embodiment provides a rotary knob lock including a lock body 31. The lock body includes a head part 311 and a limit part 312. The head part 311 has a diameter greater than a diameter of the limit part 312. The head part 311 is provided with a first magnet 33 inside, and the limit part 312 is provided with a limit block 32. As shown in FIG. 2, this embodiment also provides a maintenance tool 4 including a body 41. The body 41 is provided with a second magnet 42 inside. The second magnet 42 is magnetically attracted to the first magnet of the rotary knob lock.

Figure 3:
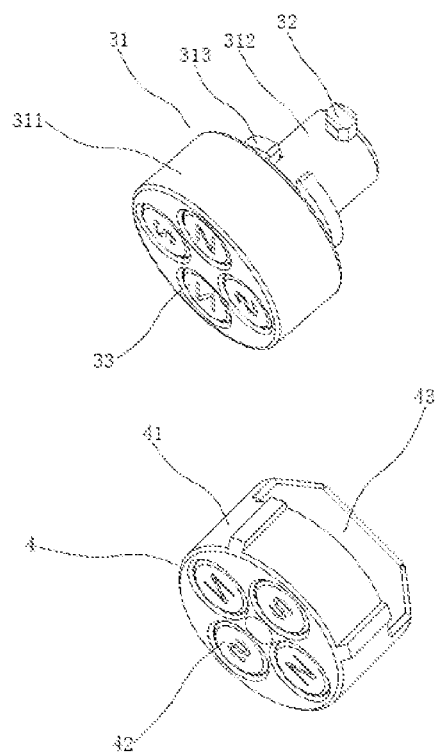
FIG. 3 is a schematic view showing pairing of the rotary knob lock and maintenance tool of the embodiment of the present application.

Referring also to FIG. 3, the second magnet 42 on the maintenance tool 4 is aligned with the first magnet 33 on the rotary knob lock and magnetically attracted to each other, and then an original magnetic field is changed by rotating the maintenance tool 4 to generate a torque to drive the lock body 31 of the rotary knob lock to rotate, to realize locking and unlocking.

As shown in FIG. 3, as an optimized way, there are four first magnets 33 inside the lock body 31, and N poles and S poles of the four first magnets 33 are distributed alternately. Correspondingly, there are four second magnets inside the body 41 of the maintenance tool 4, and N poles and S poles of the four second magnets 42 are distributed alternately. The limit part 312 is provided with a limit ring 313 at an end near the head part 311. Two limit blocks 32 are symmetrical to each other. The body 41 is provided with an operating portion 43, and the operating portion 43 can drive the maintenance tool 4 to rotate.

Figure 4:
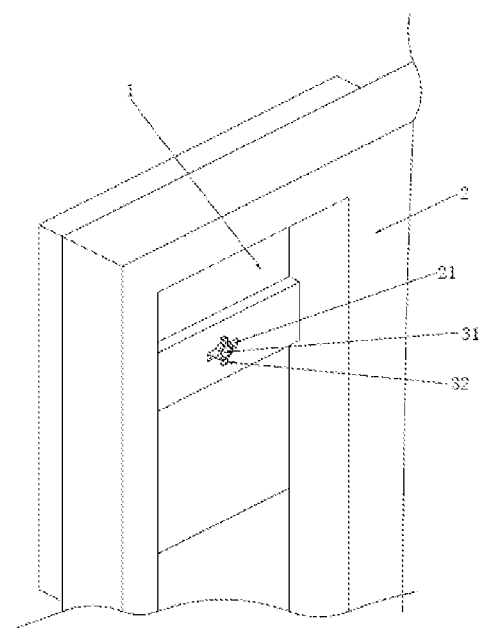
FIG. 4 is a partial structural view of an LED display of the embodiment.
Figure 5:
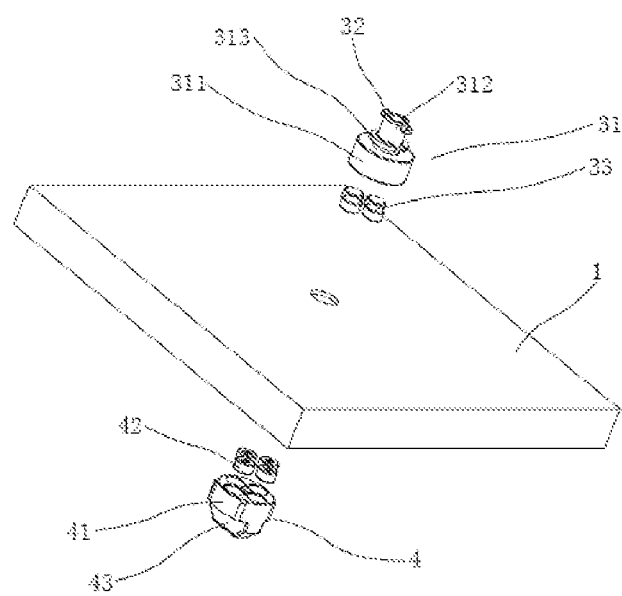
FIG. 5 is a decomposed structural schematic diagram of the matching of the LED display module, knob lock and maintenance tool of the embodiment.

As shown in FIG. 4, this embodiment also provides a LED display, the LED display includes an LED display module 1 and a cabinet 2. The LED display module 1 is provided with a rotary knob lock on the back. The LED display module 1 is mounted on the cabinet 2 through the rotary knob lock. As shown in FIG. 5, the rotary knob lock includes a lock body 31, and the lock body 31 is rotatable relative to the LED display module 1. One end of the lock body 31 is provided with a limit block 32, and the other end of the lock body 31 is provided with a first magnet 33. As shown in FIG. 4, the cabinet 2 is provided with a rectangular avoidance hole 21. When the LED display module 1 is mounted on the cabinet 2, the first magnet 33 and the limit block 32 are located on both sides of the avoidance hole 21 respectively. When the limit block 32 on the lock body 31 is aligned with the avoidance hole 21, the rotary knob lock is in an unlocked state, and the limit block 32 can be removed from the cabinet 2 through the avoidance hole 21. When the limit block 32 on the lock body 31 is misaligned with the avoidance hole 21, the rotary knob lock is in a locked state, and the cabinet 2 limits the movement of the limit block 32. Combined with FIG. 2, this embodiment also provides a maintenance tool 4 pairing with the rotary knob lock. The maintenance tool 4 includes the body 41. The body 41 is provided with a second magnet 42 inside. After the rotary knob lock is fixedly mounted in the LED display module 1, the maintenance tool 4 is firstly placed on the front of the LED display module 1 and aligns approximately with the rotary knob lock. The first magnet 33 and the second magnet 42 are attracted by each other for opposite poles attracting each other, thus the body 41 of the maintenance tool 4 is aligned with the lock body 31 of the rotary knob lock and magnetically attracted to each other, and then the original magnetic field is changed by rotating the body 41 of the maintenance tool 4 to generate the torque to rotate the lock body 31 of the rotary knob lock, to realize the locking and unlocking, and thus the fixing and disassembly of the LED display module 1 is realized. The rotary knob lock of the embodiment has a simple structure, is easily locked and unlocked, which is convenient for maintenance and saves time and labour.

In this embodiment, as shown in FIG. 5, there are four first magnets 33 in the lock body 31, and the N poles and S poles of the four first magnets 33 are distributed alternately. Correspondingly, there are also four second magnets 42 inside the body 41 of the maintenance tool 4, and the N poles and S poles of the four second magnets 42 are distributed alternately. The lock body 31 includes a head part 311 and a limit part 312 connected together, and a diameter of the head part 311 is larger than a diameter of the limit part 312. The first magnet 33 is located inside the head part 311, and the limit block 32 is located at the end of the limit part 312 away from the head part 311, the rotary knob lock is mounted at the back of the LED display module 1, the head part 311 is located inside the LED display module 1, and the limit block 32 is located outside the LED display module 1. In this embodiment, an end of the limit part 312 near the head part 311 is provided with a limit ring 313. When the rotary knob lock is mounted in the LED display module 1, the head part 311 is located inside the LED display module 1 and the limit ring 313 is located outside the LED display module 1. In this embodiment, two limit blocks 32 are symmetrically provided. In this embodiment, as shown in FIG. 2, the body 41 of the maintenance tool 4 is provided with an operating portion 43 for driving the maintenance tool 4 to rotate.

In the present application, after the rotary knob lock is fixedly mounted in the LED display module, the maintenance tool is firstly placed on the front of the LED display module and aligns approximately with the rotary knob lock. The first magnet and the second magnet are attracted by each other for opposite poles, thus the body of the maintenance tool is aligned with the lock body of the rotary knob lock and magnetically attracted to each other, and then the original magnetic field is changed by rotating the body of the maintenance tool to generate the torque to drive a rotation of the lock body of the rotary knob lock, to realize the locking and unlocking, and then to realize the fixing and disassembly of the LED display module. The structure is simple, the operation of locking and unlocking is easy, the maintenance is convenient and saves time and effort. Therefore, it has industrial practicality.

The above specific embodiment is only used to explain, and not to limit, the present application, modifications, without creative contribution, to the above embodiment can be made by those skilled in the art as needed after reading this specification, and it will be protected by claimed scope of the present application if the modifications are within the claimed scope of the present application.

The invention claimed is:

1. A rotary knob lock comprising a lock body, the lock body comprising a head part and a limit part, wherein the head part has a diameter greater than a diameter of the limit part, the head part is provided with a first magnet inside, and the limit part is provided with a limit block, and
wherein the limit part is provided with two limit blocks and the two limit blocks are symmetrical to each other.

2. The rotary knob lock according to claim 1, wherein the head part is provided with at least two first magnets inside, and N poles and S poles of the two first magnets are distributed alternately.

3. The rotary knob lock according to claim 1, wherein the limit block is located at an end of the limit part away from the head part.

4. The rotary knob lock according to claim 3, wherein the limit part is provided with a limit ring at an end near the head part, when the rotary knob lock is mounted on a light-emitting diode (LED) display module, the head part is located inside the LED display module and the limit ring is located outside the LED display module.

5. A maintenance tool paired to the rotary knob lock according to claim 1, wherein the maintenance tool comprises a body, the body is provided with a second magnet inside, and the second magnet is magnetically attracted to the first magnet of the rotary knob lock.

6. The maintenance tool according to claim 5, wherein the body is provided with an operating portion for driving the maintenance tool to rotate.

7. An LED display, comprising an LED display module and a cabinet, wherein the LED display module is provided with a rotary knob lock, a lock body of the rotary knob lock comprises a head part and a limit part, the head part has a diameter larger than a diameter of the limit part, the head part is provided inside with a first magnet, the limit part is provided with a limit block; the cabinet is provided with an avoidance hole, when the LED display module is mounted on the cabinet, the first magnet and the limit block are distributed on both sides of the avoidance hole, and
wherein there are provided symmetrically with two limit blocks.

8. The LED display according to claim 7, wherein there are at least two the first magnets, and N poles and S poles of the two first magnets are cross-distributed.

9. The LED display according to claim 7, wherein the limit block is located at an end of the limit part away from the head part.

10. The LED display according to claim 9, wherein the limit part is provided with a limit ring at an end near the head part, when the knob lock is mounted on the LED display module, the head part is located inside an LED display module and the limit ring is located outside the LED display module.

* * * * *